United States Patent [19]

Kroger et al.

[11] 4,425,194

[45] Jan. 10, 1984

[54] PHOTO-VOLTAIC POWER GENERATING MEANS AND METHODS

[75] Inventors: Ferdinand A. Kroger, Los Angeles; Robert L. Rod, Marina del Rey; Ramachandra M. P. Panicker, Camarillo, all of Calif.; Mark B. Knaster, Ambler, Pa.

[73] Assignee: Monosolar, Inc., Calif.

[21] Appl. No.: 460,013

[22] Filed: Jan. 21, 1983

Related U.S. Application Data

[63] Continuation of Ser. No. 899,227, Apr. 24, 1978, abandoned, which is a continuation-in-part of Ser. No. 883,150, Mar. 3, 1978, abandoned, which is a continuation of Ser. No. 693,890, Jun. 8, 1976, abandoned.

[51] Int. Cl.³ .................. H01L 31/18; H01L 31/06
[52] U.S. Cl. .................................. 204/2.1; 136/255; 136/260; 136/258; 136/264; 204/56 R; 204/86; 204/92
[58] Field of Search ......... 136/260, 255, 264, 258 PC; 204/2.1, 56 R, 86, 92

[56] References Cited

U.S. PATENT DOCUMENTS

| | | | |
|---|---|---|---|
| 3,051,636 | 8/1962 | Kaspaul | 204/92 |
| 3,290,175 | 12/1966 | Cusano et al. | 136/255 |
| 3,419,484 | 12/1968 | Ammerman et al. | 204/86 |
| 3,492,167 | 1/1970 | Nakayama et al. | 136/260 |
| 3,568,306 | 3/1971 | Yamashita | 29/572 |
| 3,573,177 | 3/1971 | McNeill | 204/32 |
| 4,064,326 | 12/1977 | Manassen et al. | 429/111 |

FOREIGN PATENT DOCUMENTS

| | | |
|---|---|---|
| 872973 | 7/1961 | United Kingdom . |
| 1161340 | 8/1969 | United Kingdom . |
| 1184387 | 3/1970 | United Kingdom . |

OTHER PUBLICATIONS

H. Von Gobrecht et al., "Elektrochemische Abscheidung von Metallseleniden", *Berichte Deutsche Bunsengesellschaft*, vol. 67, 930 (1963).

G. Hodes et al., "Photoelectrochemical Energy Conversion & Storage Using Polycrystalline Chalcogenide Electrodes", *Nature*, vol. 261, pp. 403–404 (1976).

R. M. P. Panicker et al., "Cathodic Deposition of CdTe from Aqueous Electrolyte", *J. Electrochem. Soc.*, vol. 125, pp. 566–572 (Apr. 1978).

*Primary Examiner*—Aaron Weisstuch
*Attorney, Agent, or Firm*—Finnegan, Henderson, Farabow, Garrett & Dunner

[57] ABSTRACT

A photo-voltaic power cell based on a photoelectric semiconductor compound and the method of using and making the same. The semiconductor compound in the photo-voltaic power cell of the present invention can be electrolytically formed at a cathode in an electrolytic solution by causing discharge or decomposition of ions or molecules of a non-metallic component with deposition of the non-metallic component on the cathode and simultaneously providing ions of a metal component which discharge and combine with the non-metallic component at the cathode thereby forming the semiconductor compound film material thereon. By stoichiometrically adjusting the amounts of the components, or otherwise by introducing dopants into the desired amounts, an N-type layer can be formed and thereafter a P-type layer can be formed with a junction therebetween. The invention is effective in producing homojunction semiconductor materials and heterojunction semiconductor materials. The present invention also provides a method of using three electrodes in order to form the semiconductor compound material on one of these electrodes. Various examples are given for manufacturing different photo-voltaic cells in accordance with the present invention.

32 Claims, 14 Drawing Figures

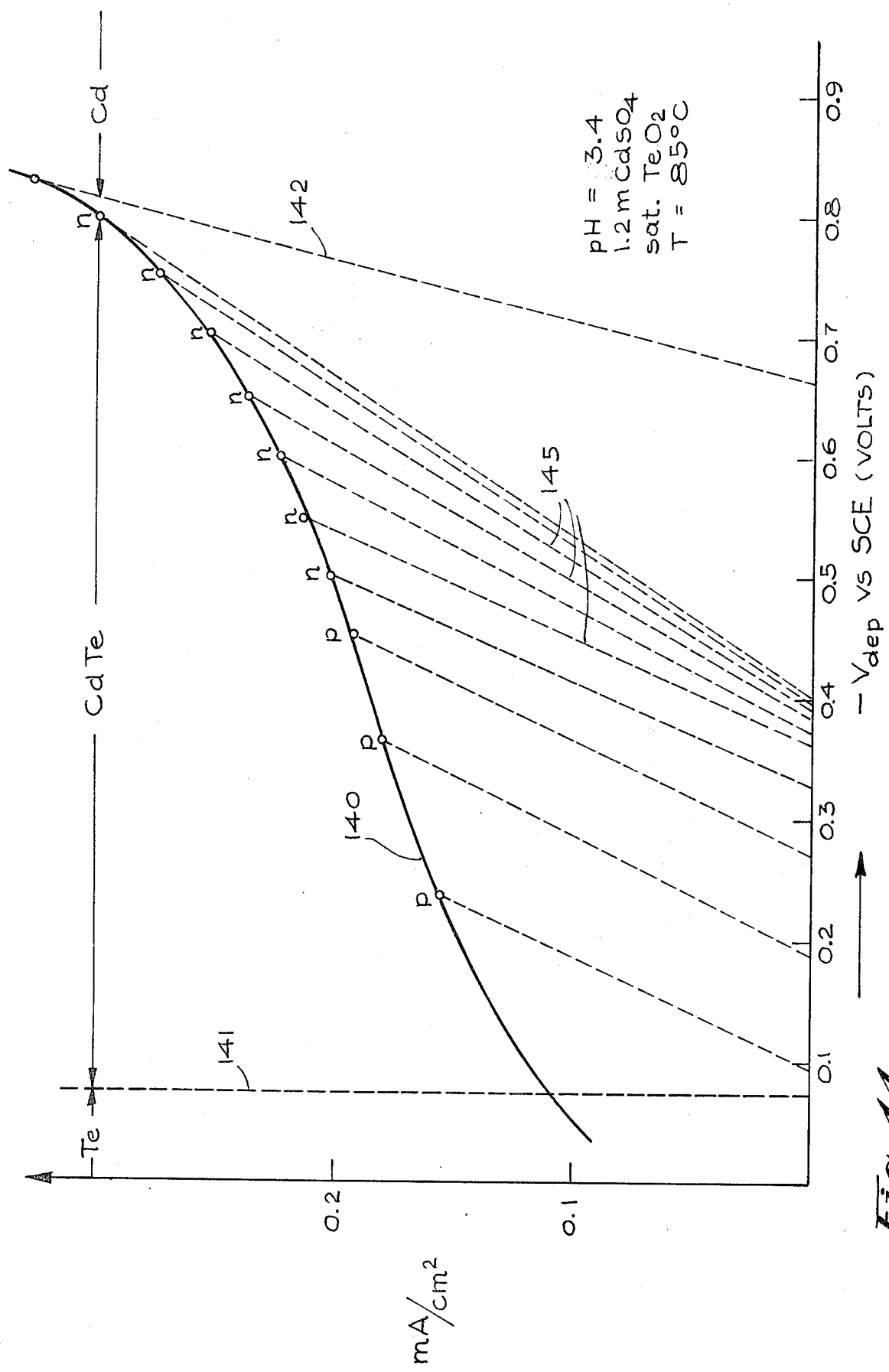

PHOTO-VOLTAIC POWER GENERATING MEANS AND METHODS

STATEMENT AS TO RIGHTS TO INVENTIONS MADE UNDER FEDERALLY-SPONSORED RESEARCH AND DEVELOPMENT

The Government has rights in this invention pursuant to contract No. DE-AC01-76ET20218 awarded by the U.S. Department of Energy.

CROSS-REFERENCE TO RELATED APPLICATIONS

This application is a continuation of Ser. No. 899,227 filed Apr. 24, 1978, now abandoned, which is a continuation-in-part of the copending application Ser. No. 883,150, filed on Mar. 3, 1978, now abandoned, which in turn is a continuing application of the parent application, Ser. No. 693,890, filed on June 8, 1976, now abandoned, all applications being assigned to the assignee of the present application.

BACKGROUND OF THE INVENTION

1. Field of the Invention

The invention relates to systems and methods for generating electrical power from light radiation, and specifically from solar radiation.

2. Description of the Prior Art

The increasingly aggravated inadequacy of fossil fuels for energy generation of all types has led to many efforts to tap alternative energy sources. A particularly attractive alternative source is light radiation, and particularly solar radiation, which comprises enormous amounts of easily accessible energy and is largely untapped. Among the most important existing devices for converting solar energy into electricity are devices of the type developed in the space effort. These devices comprise networks of smaller area thin monocrystalline layers connected in series. These devices have relatively high efficiency in terms of power generation in relation to weight. This criterion, however, is substantially inapplicable to the problem of power generation for normal commercial and consumer purposes, in which the criterion of usefulness is related to economic factors, such as power generation per unit cost. Under this criterion of efficiency units which are useful in the space effort are impractical. These units are comprised of photoelectric material which is substantially monocrystalline and must be grown from crystalline solution, with a high failure rate. These constraints limit such units to small dimensions and require many such units to provide even a minimal power source.

Devices and fabrication techniques utilizing polycrystalline semiconductive materials have generally proven inadequate due to high production costs. Among the contributing factors to these high costs is the requirement of use of structural materials of high heat resistance due to the high temperature utilized with these fabrication techniques. Moreover, such devices generally utilize metallic internal conductors, thus further increasing costs. Also, the failure rate in fabricating such devices is relatively high because of penetration by impurities, in the course of fabrication. Further, control of the deposition of semiconductive material in such processes presents substantial problems.

There has been a recent attempt to form photo-voltaic power generating means with a compound semiconductor material having an N-type region and a P-type region and in which the N-type and P-type regions were doped. In this case, the first semiconductor section, constituting an N-type section, was formed by a vapor phase deposition of a metal, such a cadmium with the addition of sulfur to provide a cadmium sulfide layer. The second, or P-type, semiconductor section was formed by dipping the material into a hot aqueous solution of CuCl which caused formation of $Cu_xS$. However, the results were poor since the cadmium sulfide was sometimes porous, giving rise to shorted junctions. In addition, a large amount of unused cadmium was required in the deposition, thereby creating a substantially expensive photo-voltaic power generating means, oftentimes of low efficiency.

U.S. Pat. No. 3,573,177 to William McNeill describes a prior art technique by which polycrystalline cadmium, zinc, or cadmium-zinc sulfide or selenide is formed by electrochemical deposition on a Cd or Zn or Cd, Zn anode and where sulfur or selenium is provided from a solution containing $S^=$ or $Se^=$ ions and which polycrystalline material is usable as a semiconductor material. The concept of forming thin films of semiconductor materials by electrochemical techniques is relatively new and due, in part, to the teachings in the aforesaid McNeill patent. In accordance with the McNeill patent, electrochemical discharge of ions, such as those yielded by sulfides or selenides dissolved in an electrolyte, occur with respect to cadmium or zinc acting as an anode in an electrolytic cell. This electrochemical discharge converts the zinc or cadmium, or the alloys of these metals, to the corresponding sulfides or sulfoselenides.

The McNeill patent has advanced the art of producing semiconductive materials by electrochemical techniques and presents many advantages, including the ability to apply films of semiconductor materials to irregularly shaped substrates which were not thoroughly cleaned. Nevertheless, the McNeill patent suffers from many limitations in that the end product is not necessarily capable of functioning as a P-N semiconductor junction material necessary in the operation of a photo-voltaic cell or similar diode. McNeill is essentially concerned with the manufacture of non-junction semiconductor films, such as those found in the electroluminescent panels, electrosonic transducers and photosensitive conductors.

The essence of the McNeill patent lies primarily with anodic plating, with discharge of $S^=$ and $Se^=$ ions. However, it is not known that the McNeill process can be applied to e.g. discharge of $Te^=$ ions which is more ideal in the case of photo-voltaic cells. Yet it is such a discharge, forming CdTe and a ZnTe that is of prime importance for the manufacture of solar cells since cadmium telluride has a direct band-gap uniquely optimized for sunlight at 1.5 eV.

There has also been a proposed prior art technique for electrochemically precipitating metals at a cathode for producing a selenium rectifier. This technique is reported in an article entitled, "Electrochemische Abscheidung von Metallseleniden", by H. Von Gobrecht, H. D. Liess and A. Tausend, in *Ber. Deutsche Bunsengesellschaft, Vol.* 67 (1963), page 930. This article does not describe the production of photo-voltaic power generating cells. In accordance with this prior art technique, deposition of the less noble component and the more noble component must be very carefully controlled due to the difference in standard precipitation potentials. The more noble component had to be added in carefully controlled small doses in order to operate with this technique.

Therefore, there has been, and is, a well recognized, but unfulfilled need for photo-voltaic power generating means having relatively high power generating capability per dollar of cost to produce and having a form suitable for commercial and consumer use, and for a method for producing such means.

OBJECTS OF THE INVENTION

It is, therefore, the primary object of the present invention to provide a photo-voltaic power generating means in the form of a power generating cell which is constructed of semiconductor material having an N-type region and a P-type region.

It is another object of the present invention to provide a photo-voltaic power generating means of the type stated which operates with a relatively high degree of efficiency and which can also be made at a relatively low cost, compared to conventional and proposed photo-voltaic power generating means.

It is a further object of the present invention to provide a photo-voltaic power generating means which can be produced in the form of a relatively flat sheet for disposition upon a surface which is located to receive solar radiation.

It is an additional object of the present invention to provide a low-temperature method of producing photo-voltaic power generating means and which eliminates the high temperature operation which was heretofore employed to produce such power generating means having semiconductor materials.

It is also an object of the present invention to provide a method of cathodically depositing semiconductor forming material at the cathode of an electrolytic cell.

It is yet another object of the present invention to provide a photo-voltaic power generating means which is created by cathodically depositing semiconductor forming material at the cathode of an electrolytic cell to produce a semiconductor compound which is photo-reactive.

It is another salient object of the present invention to provide a method of producing photo-voltaic power generating means of the type stated which is highly efficient and substantially eliminates material waste.

With the above and other objects in view, our invention resides in the novel features of form, construction, arrangement and combination of parts presently described and pointed out in the claims.

BRIEF DESCRIPTION OF THE DRAWINGS

Figure 1:
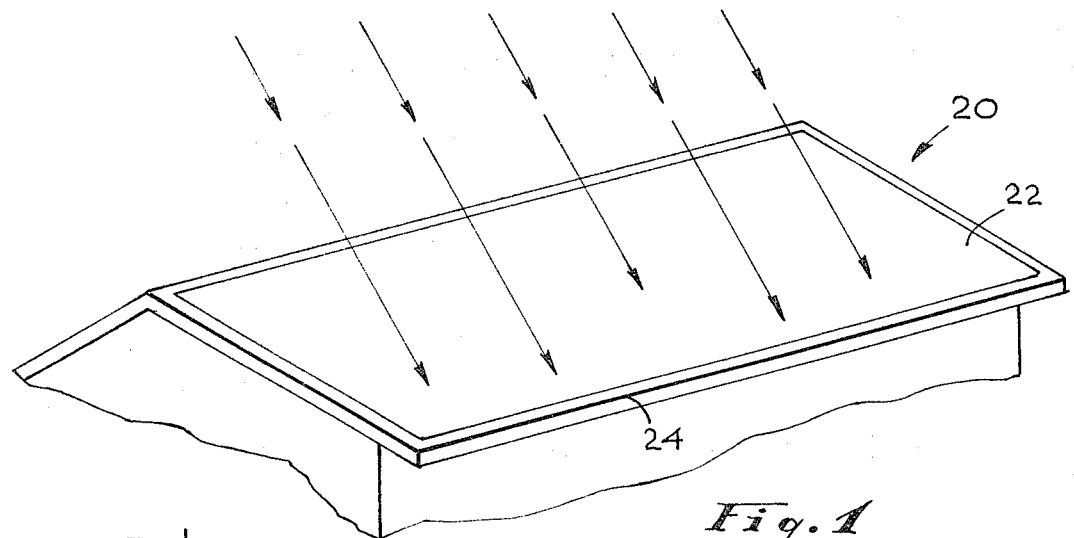
Figure 2:
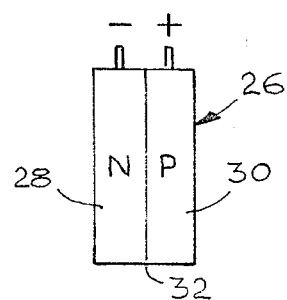
Figure 3:
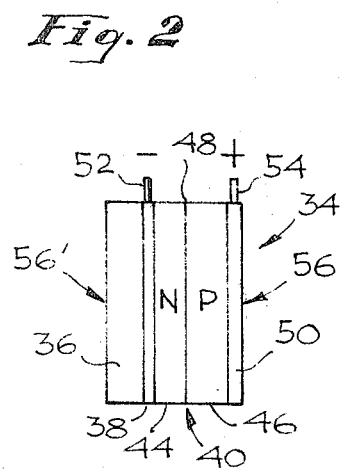
Figure 4:
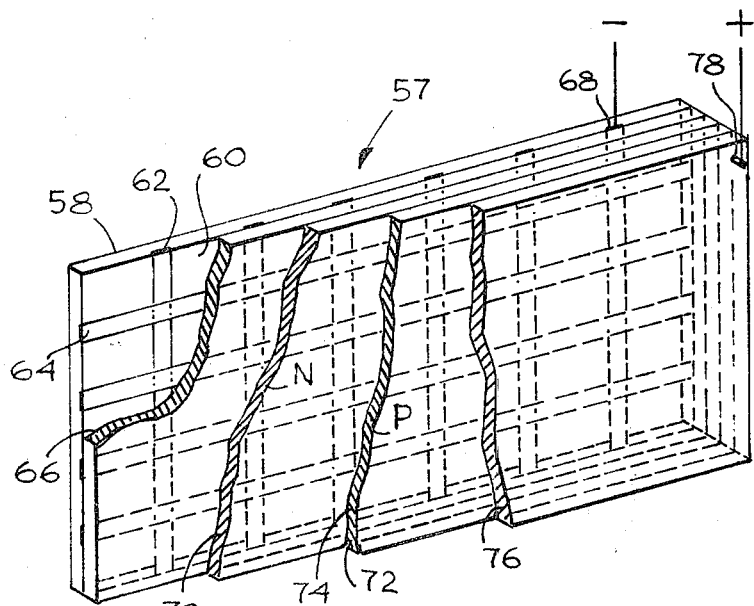
Figure 5:
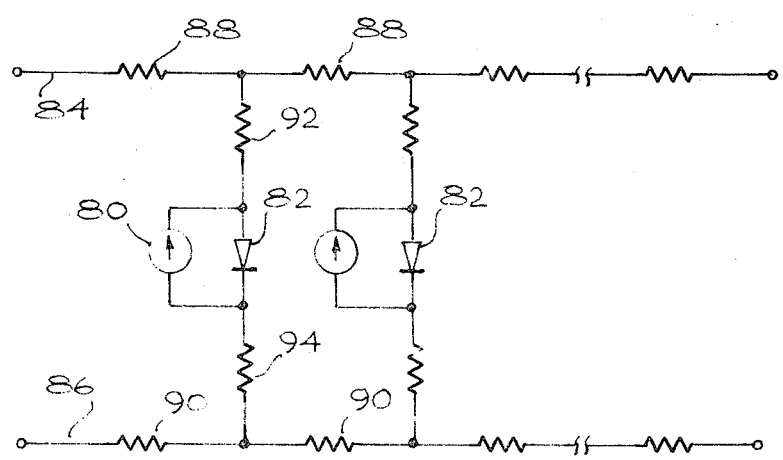
Figure 6:
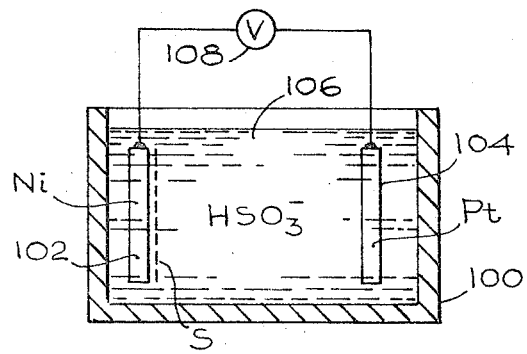
Figure 7:
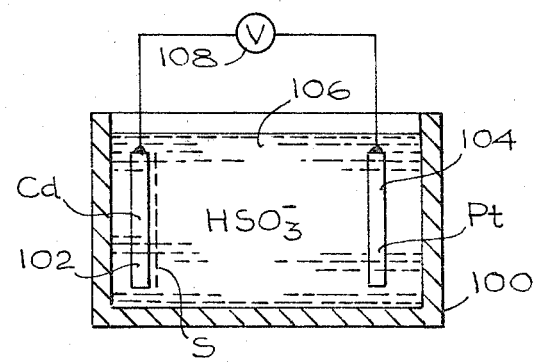
Figure 8:
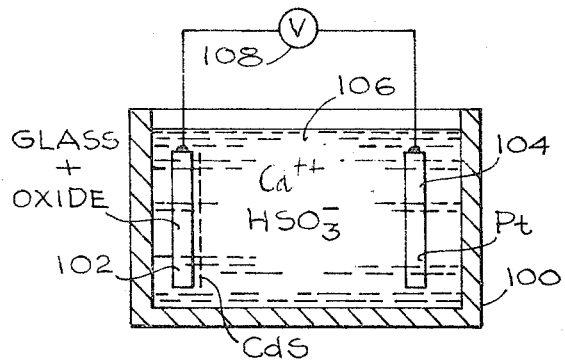
Figure 9:
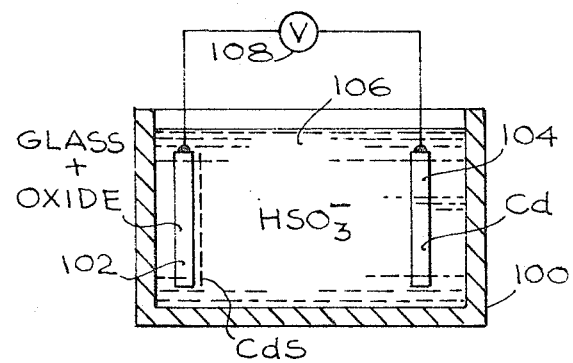
Figure 10:
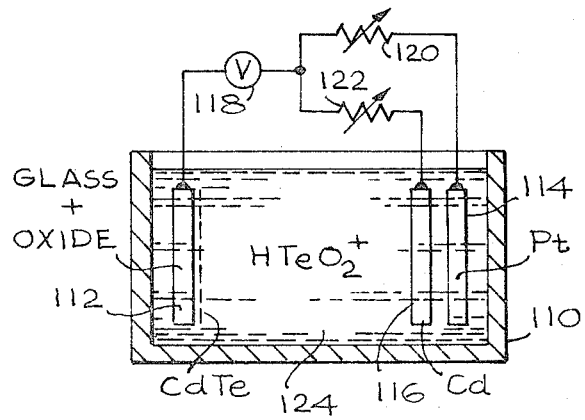
Figure 11:
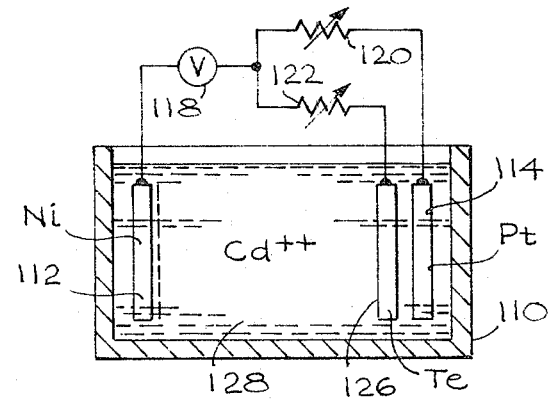
Figure 12:
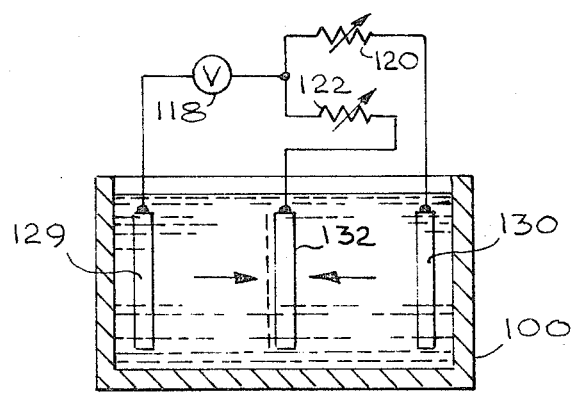
Figure 13:
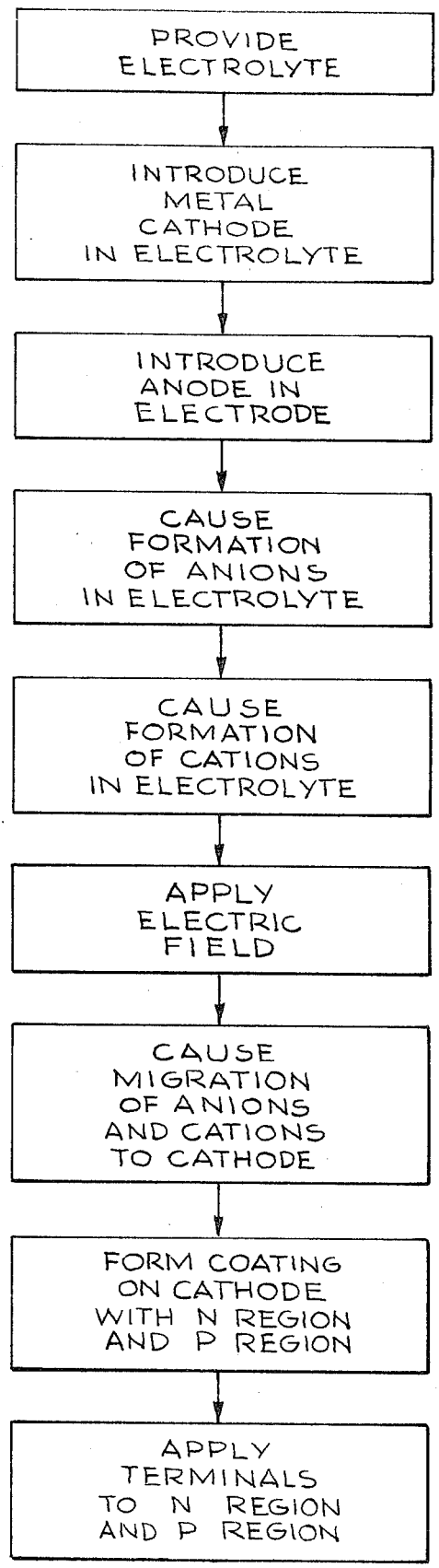

Having thus described in the invention in general terms, reference will now be made to the accompanying drawings in which:

FIG. 1 is a somewhat simplified perspective view of a photo-voltaic power generating means in accordance with the present invention;

FIG. 2 is a somewhat schematic side-elevational view of a power cell in the power generating means of FIG. 1;

FIG. 3 is a side-elevational view, somewhat similar to FIG. 2, and showing a slightly modified form of photo-voltaic power cell;

FIG. 4 is a perspective view, partially broken away and shown in section, and showing a preferred power cell construction in accordance with the present invention;

FIG. 5 is a schematic electrical circuit view showing an equivalent electrical network for a solar energy operated cell in accordance with the present invention;

FIG. 6 is a schematic side-elevational view showing one method for forming a photo-voltaic power cell in accordance with the present invention;

FIG. 7 is a schematic side-elevational view, somewhat similar to FIG. 6, and showing another modified form of creating a photo-voltaic power cell in accordance with the present invention;

FIG. 8 is a schematic side-elevational view, somewhat similar to FIG. 6, and showing another method for forming a photo-voltaic power cell in accordance with the present invention;

FIG. 9 is a somewhat schematic side-elevational view, somewhat similar to FIG. 6, and showing still another modified form of method for creating a photo-voltaic power cell in accordance with the present invention;

FIG. 10 is a schematic side-elevational view, somewhat similar to FIG. 9, and showing yet another modified form of method for creating a photo-voltaic power cell utilizing a plurality of anodes in accordance with the present invention;

FIG. 11 is a schematic side-elevational view, somewhat similar to FIG. 10, and showing another modified method of the present invention which also utilizes a pair of anodes;

FIG. 12 is a schematic side-elevational view, somewhat similar to FIG. 11, and showing an additional modified form of the present invention for creating a photo-voltaic power cell in accordance with the present invention;

FIG. 13 is a schematic diagrammatic view showing the steps utilized in the method of the present invention; and FIG. 14 is a chart relating the plating voltage to the current in milliamperes per square centimeter for cadmium telluri to show how the composition of the cadmium telluride changes with the plating voltage.

DETAILED DESCRIPTION

Referring now in more detail and by reference characters to the drawings, 20 designates a photo-voltaic power generating means, as depicted in FIG. 1, in a form suitable for commercial and consumer use and configured as a sheet or panel 22. This panel 22 is sized to be disposed upon a surface 24 as shown as the roof of a dwelling. In the depicted application, the photovoltaic power source 20 generates power as a consequence of having solar radiation incident thereupon. The invention may, of course, be utilized in a wide range of other applications, including heavy stationary installations, vehicles, and laboratory uses, with other light sources and in other configurations.

The power generating means 20 comprises as a major integral component thereof, a photo-voltaic power generating cell 26, (FIG. 2) which is formed of semiconductor material. In this respect, the sheet or panel 22 may be comprised of a plurality of series-connected cells, such as the cells 26. The cell 26 in its simplest form includes an N-type region 28 and a P-type region 30, which are separated by a junction 32, in a manner to be hereinafter described in more detail. While the present invention is effective with a hetero-junction, it is also possible to produce the N-type region 28 and the P-type region 30 with homo-junction therebetween.

The term "photovoltaic" as used herein refers to a compound semiconductor which is capable of generating electrical power when the compound semiconductor is subjected to the incidence of solar radiation or similar forms of light radiation. The semiconductor in its simplest form is often referred to as a "cell". In many cases the term "cell" is also used to encompass not only the compound semiconductor, but the substrate and terminals or electrodes as well. In each case the cell will have two regions, e.g. an N-type region and a P-type region, establishing a junction therebetween.

The N-type region 28 is formed of an N-type material which may comprise any of a number of well-known compositions which exhibit N-type semiconductor properties. The P-type region 30 is formed of a P-type material formed of any well-known composition which exhibits P-type properties. In a preferred aspect of the invention, the cation is preferably cadmium or zinc and the anion is sulfur, selenium or tellurium.

FIG. 3 illustrates a modified form of photo-voltaic power generating cell 34 which comprises a substrate 36 formed of a relatively inert electrically non-conductive material which is preferably transparent to light radiation. The substrate 36 may be formed of a relatively low-cost material, such as any of a number of plastics, and particularly that plastic sold under the trademark "Mylar" and the material sold under the trade name "Kapton" of relatively low heat resistance and of low cost. However, any of a number of other substrate materials may also be used in accordance with the present invention, and include any fiber reinforced plastic substrates, such as for example, epoxy resin impregnated fiberglass substrates, or the like. In essence, the substrate should be one which is relatively inert with respect to electrical conductivity and may be without substantial heat resistance.

Bonded to one flat surface of the substrate 36 is an electrically conductive metal electrode 38 which may be composed of a relatively inert electrically conductive metal, such as stainless steel, nickel or the like. In this case, it can be observed that the electrode 38 comprises a thin layer or sheet, although the electrode 38 may take other forms and may have other positions in accordance with the present invention. The electrode 38 may also be secured to the substrate 36 by any of a variety of known techniques, such as metal vapor deposition, electrolytic deposition, or the like. Otherwise, the electrode 38 may be prefabricated as a strip and bonded to the substrate 36 by means of conventional adhesives, etc.

Secured to the exposed flat surface of the electrode 38 is a photo-electric power cell 40 which is substantially similar in construction to the power cell 26. In this case, the photo-voltaic cell 40 is comprised of a compound semiconductor material. This cell 40 is provided with an N-type section region 44, similar to the N-type section 28, and a P-type section 46, similar to the P-type section 30, with a junction 48 therebetween. An electrically conductive cover sheet 50 is secured to the outer surface of the section 30.

The N-type region 44 and the P-type region 46 are similarly formed in the same manner as the N-type region 28 and the P-type region 30 were formed in the cell 26. Moreover, in this case, the N-type region 44 and the P-type region 46 may also have a homo-junction 48 therebetween, as in the case where the N-type and the P-type regions are formed of substantially the same material. Otherwise, these two regions may be formed of different materials and have a heterojunction 48 therebetween. Finally, an electrically conductive connector 52 is connected to the metal electrode 38 and an electrically conductive connector 54 is connected to the sheet 50. This cell 34 operates in substantially the same manner as the cell 26 and will generate a current flow through a load connected across the connectors or terminals 52 and 54 when solar radiation is incident upon the cell 34.

The cell 26 or the cell 34 may be completely enveloped within and contained by a container, or similar form of container means, or so-called envelope (not shown), which is formed of a material transparent to light radiation. The container means may be formed of any of a number of known materials capable of passing solar radiation and including all forms of light radiation as for example, plastic material including polyethylene sheets. Polybutyral sheets and other forms of plastics, as well as other electrically non-conductive like transparent materials, may also be used in the formation of the container.

The cell 40, as well as the previously described cells may be formed of cadmium sulfide or cadmium selenide, and preferably of cadmium telluride. In the depicted embodiment, the cell 40 is in the form of a thin layer, although in other applications the cell 40 and the N-type and P-type regions 44 and 46 may be configured in any appropriate manner. As described in detail below, the thickness of the cell 40 is readily controllable through the method of fabrication of the photo-voltaic power generating means in accordance with the invention, thereby affording substantial economy. In any event, the cell 40, as well as the other layers of the cell 40, as described below, may be of the order of 1–20 microns in thickness, although the cells will preferably range in thickness between about 0.1 to 40 microns.

The top surface of the container means for the cells 26 or 34 and cover sheet 50 would be transmissive to light and comprises an element of a light path 56 as schematically illustrated in FIG. 3 of the drawings. An additional or alternative light path (not shown) may be provided through the lower surface of the cover in which the substrate 36 and electrode 38 may comprise grid structures to permit access of light and will be very thin to minimize internal electrical resistance.

In accordance with the above, it may be observed that the photo-voltaic power generating means of the present invention may be disposed in contact with light receiving surfaces, such as roofs of structures, in the form of continuous panels which may be fitted to the size. These features, among other previously described and hereinafter described in more detail, constitute a substantial advantage of the invention in terms of ease of use and economy.

As indicated previously, the cover means over the photo-voltaic cell would be transmissive of light and comprises an element of the path 56 giving access to the cell 40, that is through the P-type semiconductor region 46. In this case, the P-type semiconductor region 46 is the region which is exposed to light radiation, although it should be observed that the N-type region 44 could also be the outermost region exposed to light radiation through the path 56.

The leads 52 and 54 connect the cell 40, and hence the power generating means, to an external load (not shown). This load may comprise, for example the main power source of a vehicle or of electrical systems within a vehicle. In operation, light traversing the light path 56 strikes the photo-cell 40 and causes a movement of electrons from the semiconductor material of the P-type region 46 across the junction 48 to the N-type region 44, under well-known phenomena of photointeraction with semiconductive materials. Consequently, a migration of electrons to the minus terminal 52 occurs and a current appears in the leads and in the load.

In the embodiment of the cell illustrated in FIG. 3, where the light path is designated 56, at least the electrode 50 must be transparent. In this case, the electrode 38 and the substrate 36 would not have to be transparent. However, in accordance with the present invention, the cell could have a transparent electrode 38 and a transparent substrate 36, formed of a conductive glass or transparent plastic substrate, as described in more detail hereinafter. In this construction, the cell would respond to a light path designated as 56' in FIG. 3 of the drawings. However, it should be recognized that all components of the cell 34 could be transparent.

Where the cell 34 is constructed so that it responds to the light path 56, the narrow band gap material will be incidental to the electrodes 38 and the wide band gap material will be incidental to the electrode 50. When the cell 34 is constructed so that it responds to the light path 56', the wide band gap material will be incidental to the electrode 38 and the narrow band gap material will be incidental the electrode 50. In essence, the wide band gap material will always face the source of light. In the present invention, a CdS layer has a wider band gap than the CdSe layer, which in turn, has a wider band gap than a CdTe layer.

In accordance with the invention, the electrode 50 need not be formed of a metal, but could be formed of a conductive transparent oxide as hereinafter described. Again, the electrode 38 could be formed of a conductive transparent oxide. In addition the substrate 36 could be conducting and constitute an electrode, thereby eliminating the necessity of the electrode 38.

One of the preferred embodiments of a photo-voltaic power cell construction in accordance with the present invention, is more fully illustrated in FIG. 4 of the drawings. In this case, the preferred embodiment of the power cell is designated by reference numeral 57 and includes a substrate 58 which is electrically non-conductive, such as a glass substrate. This substrate 58 is preferably relatively thick with about a thickness of one-eighth inch. A metallic electrode 60 is disposed on one flat surface of the substrate 58 and this electrode 60, in the form of a grid, is comprised of a plurality of parallel spaced apart transversely extending strips 62 and a plurality of parallel transversely spaced apart longitudinal extending strips 64. In the preferred aspect of the invention, the strips 62 and the strips 64 are located in an essentially perpendicular relationship.

A conductive coating 66 is applied to the surface of the substrate 58 in which the metal grid 60 is applied and this substrate 58 is preferably an electrically conductive coating comprised of stannous oxide doped with antimony, or indium oxide doped with tin. The electrically conductive coating essentially completely covers the entire inner surface of the substrate 58 except for the portions of the grid in contact therewith and completely covers the metal grid 60 and is in electrical contact therewith while the grid 60 is on the inner surface of the substrate 58.

This last substrate 58 may be formed of any transparent substrate material, as for example, polymethylmethacrylate, or the like. In addition, the substrate 58 could actually form part of a basic cell building block in the form of a glass roof or wall tile. In any event, it is important that the substrate is sufficiently transparent to admit the passage of light, when the cell is oriented for passage of light through the substrate.

The coating 66 which also faces the source of solar energy is coated upon the substrate 58, preferably by vapor coating, in the form of a uniform thin film of electrically conductive material which is preferably antimony-doped tin oxide, or indium oxide doped with tin. In accordance with the present invention, it has been found that it is not necessary to use a metal as an electrode and that a relatively thick transparent substrate can serve as the electrode when made electrically conductive through application of a conductive oxide. The conductive oxide is an N-type material and therefore the conductive oxide must be in contact with the N-region or otherwise another junction would be established.

The grid 60, often referred to as a "bridge", is on the surface of the substrate 58 and located between the substrate 58 and the tin oxide coating 66 in order to lower the ohmic resistance. In this way, the grid 60 becomes a first electrode which has a resistivity well below one ohm per square inch. A terminal 68 extending from one portion of the grid 60 serves as a first terminal for making electrical connection to the cell. A flat bus bar (not shown) may also extend around the periphery of the terminal portions of the grid 60 to serve as one of the two terminals for providing the electrical connection to the cell.

The photo-voltaic cell 57 will also include the cell structure of the type illustrated in FIG. 2 of the drawings. In this case, the cell structure includes an N-type section 70, equivalent to the N-type section 44 in FIG. 3, and a P-type section 72, equivalent to the P-type section 46 in FIG. 3 of the drawings, with a junction 74 therebetween. The N-type section 70 may be comprised of, e.g, cadmium selenide or cadmium telluride, whereas the P-type section may be formed of the same material with a homo-junction or a different material with a heterojunction. A relatively thin metallic film 76, is applied to the outer surface of the P-type section 72, in the manner as illustrated in FIG. 4. This outer metallic film 76 constitutes the rear electrode assembly and is provided with an electrically conductive lead wire 78.

It can be observed that the construction of the cell of FIG. 4 enables light to pass through the substrate 58, thereby eliminating the need of a third metal substrate. Moreover, it can be observed that the grid 60 is also electrically conductive and in conductive relationship to the N-type region 70 through the conductive transparent oxide film 66. The outer metallic film 76 may have a reflective surface facing the substrate 50 so as to cause reflection of the light which entered the cell and thereby cause greater energy conversion efficiency.

A relatively high efficiency value for a polycrystalline photo-voltaic cell can be achieved by a combination of factor including the use of a thin layer of cadmium telluride facilitating maximum transport of photons to the junction region. The use of a thin film of modified metal, as for example, vapor deposited nickel, performs as an anti-reflection coating on the surface of the glass facing the sun rays. The disclosed structure is quite effective in that it reduces ohmic losses in the two electrodes and the semiconductor material.

This form of cell structure is highly advantageous over previous prior art cell structures of the single crystal type in that the cell structures described herein include substantial economies which become possible through the deposition of thin layers of one or more costly active materials on an inexpensive glass or transparent plastic substrate. In accordance with this latter embodiment of the invention, this embodiment provides the ability to make a large integrated area cell without the necessary recourse to interconnecting a multiplicity of small or independent units in a connected arrangement. Moreover, this cell structure includes the possibility of the employment of printed circuit type conductors to connect a plurality of individual cells on a tile or similar substrate in series or series-parallel arrangement.

FIG. 5 illustrates, in schematic form, a preferred electrical configuration of at least one or more cells connected in accordance with the present invention. It has been well established that absorption of photons having wave lengths shorter than the optical band-gap creates electron-hole pairs in a crystal lattice of the semiconductor material. A built-in field provided by the P-N junction, e.g. the P-N junction 32 or the junction 48, or otherwise, a Schottky barrier, separates the electrons and the holes, generating a photovoltage which biases the junction in a forward direction. Thus, in this way, a solar cell of the type proposed by the present invention can be represented by the equivalent circuit in FIG. 5 of the drawings.

More fully considering FIG. 5, it can be observed that each of the cells are designated by reference numeral 80 which functions as a current generator per unit area. These cells have a diode 82 connected in parallel therewith in the manner illustrated in FIG. 5 of the drawings. The diodes 82 are of unit area with respect to the current generators, such as the photovoltaic cells 80. In this respect, it can be observed that while the cells 80 are connected across the diodes 82 in parallel relationship, the opposed terminals of the diode 82 are connected to a positive line 84 and a ground line 86. Resistors 88 and 90 represent the sheet resistance of the electrodes and of the adjacent electrically neutral portions of the semiconductors bordering the built-in field region. Resistors 92 and 94 are representative of the contact resistances per unit area of the neutral regions with these electrodes and the resistance per unit area of these neutral regions. Each cell has similar resistive functions and diode functions in the manner as illustrated in FIG. 5 of the drawings.

For optimal conversion efficiency, the resistances 88 and 90, as well as resistances 92 and 94, the latter of which constitute parasitic resistances, should be made as small as possible. The selection of the semiconductor material for optimizing similar energy conversion thus involves maximizing the effective full type conversion into electron-pairs for solar radiation. In other words, this efficiency is created by maximizing the current generator, e.g. the solar cells 80 and maximizing the forward resistance of the various diodes 82. The maximization is required with respect to the solar cells 80 and the diode 82 and these requirements are interrelated, resulting in a compromise on the bandgap of the semiconductor material which is chosen with decreasing band-gap as more radiation is absorbed. However, the internal resistance of the barrier decreases, leading to optimal band-gaps for cadmium telluride of approximately 1.5 eV for solar radiation conversion at the earth's surface, on a cloudy day.

The technique for making the photo-voltaic power cells in accordance with the present invention is more fully illustrated in FIGS. 6-12 of the drawings with a schematic flow diagram thereof illustrated in FIG. 13 of the drawings. In essence, the present invention provides for the controllable electrochemical production of junctions of cadmium and zinc-type compound semiconductors used as photo-voltaic cells. In accordance with the invention, a semiconductor compound material is formed at the cathode where both the more noble components and the less noble components are discharged.

Referring now to FIG. 6, 100 designates a container, such as a beaker, formed of a relatively inert material. Located within the container 100 is a cathode 102 which is similarly formed of a relatively inert material, nickel as shown. However, any other form of metal electrode which is inert to the reaction, such as steel or glass or plastic provided with a conductive oxide coating, for example, may be used. Also located within the container 100 is an anode 104 which may also be inert, or otherwise the anode may be formed of cadmium or zinc or selenium or tellurium as hereinafter described. As illustrated, the anode 104 is formed of an inert platinum material. Both of the electrodes 102 and 104 are disposed within an electrolyte 106, as hereinafter described, and both the anode and the cathode are electrically connected through a source of electrical current 108.

This particular arrangement of FIG. 6 represents a simplified system which illustrates the formation of a coating at the cathode 102. By way of example, it is possible to electrochemically deposit sulfur on the nickel cathode 102 to form a sulfur coating, designated as S in FIG. 6, through the use of an electrolyte such as $SO_2$ in $H_2O$. In this way, the reaction which proceeds is represented by:

$$4e^- + 4H^+ + H_2SO_3 = 3H_2O + S.$$

This reaction demonstrates that sulfur is reduced during deposition at the cathode. Similarly, the $H_2SO_3$ is oxidized to $H_2SO_4$ at the anode. In this case, deposition would occur preferably at about 10° C. to about 20° C., with about three to six volts applied across the anode and cathode, along with a current density of 0.1 amp. per square centimeter. An optimal deposition of the sulfur occurs from a 1 mg $l^{-1}$ solution of $SO_2$ in water.

In the event that it was desired to form cadmium sulfide, as opposed to a mere sulfur layer at the cathode, the electrolyte could be changed from $SO_2$ in water to $SO_2 + 3CdSO_4.4H_2O$. In the ionic dissociation of the cadmium sulfate in water, positively charged cadmium ions are formed. These cadmium ions are attracted to and discharged at the cathode on which sulfur is also being deposited simultaneously. Thus, the cadmium and the sulfur will combine as they are simultaneously discharged at the cathode to form a layer of cadmium sulfide on the cathode. In this way, it is possible to form a film of cadmium sulfide with any desired stoichiometry, as established through the concentrations of the solutes used in the electrolyte.

FIG. 7 illustrates a system similar to FIG. 6, except that in this case the cathode which is employed will constitute the metal upon which a coating is desired to be formed. It can be observed that the cathode 102 is formed of cadmium and with the aforementioned reaction, sulfur can be cathodically deposited as along with cadmium a film upon the cadmium cathode to obtain, for example, cadmium sulfide.

FIG. 8 illustrates another embodiment of the method of making a cadmium sulfide compound film on an inert cathode, which in this case, is shown as glass having a conductive oxide coating thereon. Again, the anode is also formed of an inert material, such as platinum. In order to produce the cathodic coating of cadmium sulfide, the sulfur is introduced into a solution of the electrolyte in the form of $SO_2$ in $H_2O$, and the cadmium is introduced in the form of $3CdSO_4.4H_2O$, dissolved in this solution as previously described. It should also be observed that cadmium telluride and cadmium selenide, etc., zinc sulfide, zinc selenide and zinc telluride could be formed in the same way. Thus, in order to form a cadmium telluride coating on the cathode 102, the electrolyte would constitute tellurous acid as the source of tellurium and cadmium sulfate as the source of cadmium. In this way, the positively charged cadmium ions which are thus formed would be discharged at the cathode. In like manner, the tellurium would be deposited at the cathode and simultaneously react with the cadmium to form the cadmium telluride film.

It can be observed that it would be necessary to plate out the cadmium and the tellurium, or the other components used, in the desired stoichiometric amounts. However, the standard voltage required for plating out the cadmium and tellurium would be different. For example, a more negative voltage would be needed for the less noble component, as for example, cadmium, than for the more noble component, as for example, tellurium or selenium. While there is somewhat of a compensating effect with respect to the deposition voltages when a semiconductor component is formed, it is usually desirable to decrease the concentration of the more noble component. Thus, in the case of producing cadmium telluride, the amount of tellurium in solution would be decreased with respect to the amount of cadmium.

In order to form a cadmium telluride or similar photo voltaic device, as illustrated in FIGS. 2, 3 or 4, a first layer of cadmium telluride would be plated on the nickel anode 104, in the manner as previously described. The film thus formed on the cathode would be produced as an N-region or a P-region, depending upon the ratio of the cadmium and tellurium. After forming the first cadmium telluride layer on the cathode, as for example the glass with oxide coating cathode in FIG. 8, a second electrolyte similarly including the same compositions to produce the source of cadmium ions and the tellurium ions would also be used. However, the concentration ratio of the cadmium and tellurium in the second solution would be different from that of the first solution in order to form the other of the P-type region or N-type region. Thus, for example, if a first film of cadmium telluride were plated onto the nickel cathode 102 with, e.g., 50.01% cadmium, this film would constitute the N-type layer 28. When the second film of cadmium telluride from the second electrolyte is placed on the first film, this second film could have a lower concentration of cadmium, as, for example, 49.99%. In this case, the second film would function as, and constitute, the P-type layer 30. Thus, it can be observed that by merely controlling the stoichiometry of the metal component, e.g. cadmium, and the non-metal component, e.g. tellurium, or otherwise the ions of any other metal and non-metal components used in accordance with the present invention, it is possible to produce either an N-type layer or a P-type layer In accordance with this example, it can be observed that the two films thus formed on the nickel cathode 102 will form a homojunction 32 therebetween.

It should be observed in accordance with the present invention that it is possible to produce the N-type region and the P-type region from different materials with a heterojunction therebetween. In this case, e.g., cadmium selenide would be formed as a first film on the cathode 102, which is glass with a conductive oxide coating as shown. Thereafter, the electrolyte would be changed to plate out, e.g. cadmium telluride. The cadmium telluride would then be plated onto the first layer of cadmium selenide. In this way, the concentrations of the cadmium with respect to the tellurium and the selenium would be stoichiometric adjusted so as to create both an N-type region and a P-type region Thus, the cadmium selenide layer could operate as either a P-type region or an N-type region, but more preferably an N-type region, and the same holds true of the cadmium telluride layer, which would preferably be a P-type layer.

FIG. 9 illustrates another alternatively technique for producing a cathodically formed film in accordance with the present invention. In this case, the cathode is also inert, as, for example, the glass with the conductive oxide coating as shown. The anode, in this case, would be formed of the metal component, as, for example, a solid cadmium or zinc sheet, or otherwise a cadmium or zinc-plated sheet. The electrolyte would be comprised of those materials which provided the non-metal component of the compound. Thus, in the case of sulfur, the electrolyte would comprise a solution of $SO_2$ in water. In this way, cadmium sulfide would be formed at the cathode. Again, tellurous acid could be used as the electrolyte and, in which case, cadmium telluride would be formed on the nickel cathode.

With cadmium sulfide, it has been found that the cadmium sulfide can be formed on the cathode with a layer of a thickness of about 5 microns for preferred results. These layers are obtained from a 5% solution of $SO_2$ at about 45° C.

With the embodiment of FIG. 9, as well as some of the other embodiments herein, it is also possible to utilize cadmium and similar metal anodes containing dopants. Thus, indium as a donor dopant could be combined with the cadmium as a cadmium indium alloy to be used as the anode. In this way, the electrochemical process of the invention has the advantage of forming a cadmium sulfide film which contains indium in solid solution. By choosing the proper concentration of the cadmium-indium alloy, the indium concentration in the cadmium sulfide, or otherwise cadmium telluride, etc., can be regulated.

Thus, it can be observed that those systems illustrated in FIGS. 6, 7, 8 and 9 are all effective in forming the desired photo-voltaic film material on the cathode. Moreover, in each of these systems, by changing the electrolyte it is possible to form a second film in the same manner as previously described. Thus, if the two films are formed of the same material with one being of the N-type and the other being of the P-type, they will form a homojunction therebetween, and with different materials they will form a heterojunction therebetween.

As also previously described, the N-type region and the P-type region can be formed merely by adjusting the stoichiometry of the components used. However, it is also possible to use any of several dopants in the two regions. Thus, one of the regions could be doped with indium, aluminum or gallium, etc., as donors, or with phosphorus, arsenic or antimony, etc., as acceptors.

The present invention is primarily effective for use in producing cathodically formed films with cadmium and zinc ions and sulfur, tellurium and selenium ions. In addition, mixed crystals of the types Cd(S,Se), Cd(S,Te) Cd(Se,Te), Cd,Zn(Te), Cd,Hg(Te) and Cd,Mg(Te), etc., can be produced. Thus, any combination of mixed crystals formed of ions of cadmium, mercury, magnesium, zinc and any form of mixed crystals, as, for example, those formed of ions of sulfur, selenium and tellurium may be produced by the present invention. These substances may be pure or doped with those donors or acceptors as previously described or any other form of effective and acceptable donor or acceptor.

As indicated above, electrolytic deposition on a conducting cathode permits ions from both the metal and non-metal components in the electrolyte to be simultaneously discharged at the cathode and formed as a semiconductor compound material on the cathode. As also indicted, $SO_2$ may be used as the electrolyte in order to form a sulfide layer, as previously described. Cadmium sulfate is also used in combination with the $SO_2$ in order to form the cadmium sulfide layer. When forming the various cadmium salt films as semiconductor compounds, various acids, such as $H_2SeO_3$, $H_2SO_3$ or $H_2TeO_3$ may be used, or otherwise the alkaline salts of these acids may be used with an inert anode. In addition, solutions in acid of $SO_2$, $SeO_2$ or $TeO_2$ may be utilized with an inert anode. The composition of the deposited film is controlled through the composition of the electrolyte as described. Alternatively, it is possible to use as an electrolyte a solution of $SO_2$, $SeO_2$ or $TeO_2$ in water with an anode of Cd(Cd,Zn) (Cd,Hg) or (Cd,Mg), etc.

The ions formed by the metal components, e.g. cadmium and zinc, and the ions formed by the non-metal components, e.g. sulfur, selenium and tellurium, in solution cannot necessarily be characterized as single cations and anions. Generally, the cadmium and zinc in solution will form single cations since they are generally positively charged, e.g., $Cd^{++}$ and $Zn^{++}$. In many cases the non-metal components provide ions, e.g., $S^=$ and $Se^=$. Tellurium, for example, can adopt several valence states as $Te^=$. However, $TeO_3^=$ complex ions can be formed. Moreover, $Te^{+4}$ ions could be formed with $TeO_2$ in hydrofluoric acid. In this case, $TeF_4$ would form which dissociates to produce $Te^{+4}$ in solution.

The metal and non-metal components constitute the substantial amounts of the components in the cell thus formed. As indicated above, the metal and non-metal compounds can alloy or form mixed crystals with the elements and thus the mixed crystals or alloys constitute the substantial amounts of the components in the cell. As also indicated, various dopants may be introduced into the layers which form the semiconductor cell. While these dopants may actually alloy or form mixed crystals with the metal and non-metal components, they are not considered to form part of the mixed crystals or alloys in substantial amounts.

The electrochemical principles which might be applicable to explain the plating of both the metal and non-metal components as a semiconductor compound on the cathode are not fully understood. Nevertheless, it has been established that these components do plate out at the cathode to form a semiconductor compound. With respect to the ions of the metal components, these ions would normally be attracted to and discharged at the cathode. The reasons for the discharge of the ions of the non-metal components is more complex.

The non-metal components present ions in solution in the presence of hydrogen. Thus, for example, the non-metal components are introduced in an acid form, in most cases presenting an available source of hydrogen. It has been theorized that the hydrogen in proximity to the cathode aids in the reduction of the non-metal ions in proximity to the cathode. Thus, for example, $TeO_3^= + 6H^+$ provides $Te^{+4}$ ions which are available at and become discharged at the cathode. Nevertheless, while the exact principles may not be fully understood, it has been established that the cathodic formation of the semiconductor compound material does occur.

Various examples will now be given to show how different photo-voltaic cells in accordance with the present invention may be manufactured.

EXAMPLE 1

A liquid electrolytic bath having an anode and cathode was set up as illustrated generally in FIGS. 6-9. The cathode consisted of a sheet of glass having deposited thereon a coating of electrically conductive, light transparent indium tin oxide (sometimes called ITO). Such ITO coating is indium oxide doped with tin and has the empirical formula: $In_2O_3$:Sn. It had a thickness of approximately 4,000 A (Angstrom units), 1 Angstrom unit being $10^{-8}$ cm. The anode consisted of a bar of tellurium having the dimensions of approximately $1\frac{1}{4}'' \times 1'' \times \frac{1}{2}''$. The distance between the electrodes was about 2" to 3". In order to stir the bath, a magnetic stirring rod or bar was used. The electrolytic bath consisted of 250 ml of 1.0 N cadmium sulfate. An N (normal) solution was obtained by dividing the molecular weight by the valence of the compound to yield the number of grams required to give the specified normality. To this weight of material, water was added until 1 liter of liquid was obtained. To such cadmium sulfate solution was added 30 ml of 0.01 N indium sulfate.

In order to purify the cadmium sulfate-indium sulfate solution prior to using it to make a cell, first a piece of cadmium metal, $1'' \times 2'' \times 1/16''$ was left in the solution for ½ day to about 2 days. Then a preliminary deposition process was run under the same conditions as described in the normal cell manufacturing process described below except that the voltage was $-0.680$ volts vs. SCE measured between the cathode and a standard reference calomel electrode (sometimes called SCE), and was run for two to three hours.

The adjustment of the pH to the desired pH was accomplished by adding concentrated sulphuric acid dropwise to the solution and the pH was measured continuously with a pH meter until the desired pH level was reached.

The first step was to plate a layer of n-type cadmium telluride having a thickness of approximately 2,000 A by plating for 60 minutes at a pH of 2.85 and at a temperature of 90° C. (Celsius) onto the ITO layer serving as the cathode. The plating voltage for such plating step was $-0.635$ volts.

In the second step, the plating voltage was turned off and the cadmium telluride plated cathode was left in the bath for approximately 5 seconds. During such step the surface of the n-type cadmium telluride layer appeared to have been converted to a p-type tellurium or cadmium telluride layer.

In the third step, the previously prepared cadmium telluride p-n junction was immersed in a bath of 100 ml of 1 N sodium sulfate to which 10 ml of 0.01 N arsenic pentoxide had been added. The pH of the bath was 2.4, and the cathode coated with cadmium telluride was immersed in such bath for approximately 20 seconds. Both before and after the immersion in the sodium sulfate-arsenic pentoxide solution, the cell was rinsed for about half an hour in deionized water.

Finally, during a fourth step the cadmium telluride plated cathode was electroplated with tellurium. The tellurium was provided by an additional tellurium anode as illustrated, for example, in FIG. 11. Such electroplating step was carried out in an electrolytic bath of 1 N sodium sulfate at a pH of about 2.45 and at a temperature of 90° C. to produce a layer of tellurium of approximately 3,500 A thickness. Such plating was carried out for about 5 minutes at a voltage of $-0.550$ volts, and then for 30 minutes at a voltage of $-0.620$ volts. Finally, a back electrode was attached to the cell in the form of Aquadag which provides an ohmic contact with the tellurium. Such Aquadag is a well-known commercial product which consists of a suspension of colloidal graphite in water.

The photo-voltaic cell constructed in accordance with the foregoing steps when illuminated by a simulated solar radiation lamp, i.e., a General Electric RS/HUV Mercury Lamp simulating AM1, exhibited an open circuit voltage typically of 350 millivolts and a short circuit current of 130 to 150 microamperes per square millimeter on the average. Light entered the cell through the ITO layer.

The specific details set forth in the foregoing example can be varied substantially without materially decreasing the performance of the cell made by such method. For example, the thickness of the indium tin oxide layer may be in the range of about 3,500 to 5,000 A. Thinner layers give higher sheet resistance and less light absorption; thicker layers have the reverse properties. The concentration of the cadmium sulfate may be between about 0.25 N and 3.0 N and the concentration of the indium sulfate may be in the range of about 0.005 N to 0.02 N. It should be noted that the indium sulfate concentration was determined on the assumption that the plating efficiency was about 50%; and, therefore, the initial electrolyte concentration is about twice that which is considered achieved. The desired concentration of the indium donors in the cell is between $10^{14}$ and $10^{18}$ molecules per cubic centimeter with a preferred concentration of about $10^{17}$ molecules per cubic centimeter. The pH range for the cadmium sulfate solution may be between about 2.50 and 3.50. The present data indicates that increasing the pH will improve the photo-voltaic cell characteristics but it reduces the speed at which deposition takes place. The temperature range of the cadmium sulfate solution during deposition may be between about 20° C. and 100° C. The time of plating of the n-type cadmium telluride layer may be between about 20 and 120 minutes. The plating voltage for the n-type cadmium telluride layer may be between about $-0.500$ and $-0.645$ volts. The range of the thickness of the n-type cadmium telluride layer may be between about 1,000 and 4,000 A. The current density may be up to about 0.7 milliamperes per square centimeter of plated area.

With respect to the formation of the p-type cadmium telluride or tellurium by immersion in the solution, the range of time which the cathode may be left in the initial electrolytic bath may be between about 0 seconds to about 2 minutes. By zero seconds it is meant that the cathode is removed rapidly from the solution before the voltage is turned off. It is believed that the deposited n-type cadmium layer during the immersion period is changed to a p-type layer because some of the tellurium replaces the cadmium and indium which go into solution. With respect to the immersion of the coated cathode in the sodium sulfate-arsenic pentoxide solution, the sodium sulfate may have a concentration in the range of between about 0.25 N and 3.0 N. Similarly, the concentration of the arsenic pentoxide may be between about 0.005 N and 0.02 N. Similar to the indium concentration, the plating efficiency of the arsenic is assumed to be approximately 50% and therefore, the resulting concentration is twice what would normally be required. The immersion time in the sodium sulfate solution may range from about $\frac{1}{2}$ second to about 40 seconds. The pH range of the sodium sulfate solution may range from about 1.9 to 2.4.

With respect to the deposition of the tellurium during the fourth step, the voltage may range from about $-0.550$ to $-0.620$ volts and the pH may range from about 2.6 to 3.5. The resulting thickness of the tellurium layer may range from about 500 A to 9,000 A. The deposition time may range from about 1 minute to 60 minutes.

EXAMPLE 2

The same procedure as set forth in Example 1 was followed except that tellurium dioxide in powdered form was added in sufficient quantities to the electrolytic bath so that there was obtained a saturated solution of the tellurium oxide. In other words, there was solid tellurium dioxide in equilibrium with the solution. The performance of the cells produced under such conditions did not vary substantially from the cells produced as set forth in Example 1.

EXAMPLE 3

The same procedure as set forth in Example 2 was followed except that the tellurium electrode was replaced with an inert carbon anode so that the tellurium came solely from a saturated solution of tellurium dioxide. A cell produced with such method did not vary substantially from the cell produced as set forth in Example 2. However, the limited experimentation conducted under such circumstances indicated that the electrolytic bath conditions such as anodic processes inhibited the dissolution of additional tellurium dioxide in solution to replace the tellurium deposited at the cathode. Therefore, the bath would have to be frequently replaced.

EXAMPLE 4

The method set forth in Example 1 was followed except that it was desired to place p-type cadmium telluride directly on the n-type indium tin oxide layer. Consequently, the electrolytic bath was made up of 1,000 ml of 0.5 N cadmium sulfate to which was added 60 ml of 0.01 N arsenic pentoxide and the pH was adjusted to 3.0. Rather than using a magnetic stirring bar, the stirring of the bath during deposition was accomplished by recirculating the solution bath through a glass wool filter with a pump. P-type cadmium telluride was deposited at $-0.635$ volts for approximately 60 minutes. A subsequent tellurium layer was plated at a pH of 2.2. The resulting cell had an open circuit voltage of approximately 410 millivolts and a short circuit current of 130 to 150 microamperes per square millimeter of illuminated area.

With respect to such method set forth in the foregoing Example 4, for the p-type CdTe deposition, the pH range may be about 2.4 to 3.5 and the voltage range may be from about −0.555 to −0.640 volts. The ranges for the tellurium deposition are the same as those noted above in Example 1.

EXAMPLE 5

Another photo-voltaic cell was made by the method of the present invention by using the first step of Example 1 to lay down an initial layer of n-type cadmium telluride; however, the p-type layer of cadmium telluride was deposited by using the same bath as set forth in Example 4. With respect to a cell formed under such conditions, the measured open circuit voltage was approximately 300 millivolts.

EXAMPLE 6

Another example of the method of the present invention was to utilize the cathode described in Example 1 except that in place of the indium oxide doped with tin, tin oxide doped with antimony was utilized to give a light transparent, electrically conductive n-type layer on a glass substrate.

EXAMPLE 7

Another example of the method of the present invention of making photo-voltaic solar cells was to utilize the cathode as described in Example 6 by utilizing a layer of tin oxide doped with antimony. Like the Example 2 above, the electrolytic bath was saturated with tellurium dioxide but unlike Examples 1 or 2, an additional anode was utilized consisting of carbon or stainless steel having the dimension of approximately 1½" long × 1" wide × ½" thick. With respect to the use of the carbon anode, the current was adjusted with respect to the carbon and tellurium anode so that the carbon anode current was approximately twice the tellurium anode current. With respect to the cadmium sulfate bath, the concentration of the cadmium sulfate was 0.50 N. Unlike any of the foregoing examples, no dopants were added; however, the temperature was the same as Example 1. Initially, an n-type layer of cadmium telluride was deposited by adjusting the pH to 2.9 to 3.0 and applying a voltage of −0.610 to −0.620 volts and carrying out such deposition for about 60 minutes. Then a p-type layer of cadmium telluride was deposited by adjusting the pH to about 2.3 and applying a voltage of about −0.480 to −0.500 volts and carrying out the deposition for about 30 minutes. The resulting cell exhibited an open circuit voltage of approximately 100 millivolts.

As indicated above, in the foregoing example an n-p homojunction of cadmium telluride was produced by changing the plating voltage and the pH to convert the n-type cadmium telluride to a p-type cadmium telluride being deposited without the use of doping.

In this connection, reference is now made to FIG. 14 illustrating a curve 140 which is a function of the deposition or plating voltage as measured between the cathode and an SCE, that is a standard or saturated calomel electrode as a function of the current in milliamperes per square centimeter. Dotted vertical line 141 shows pure tellurium being obtained to the left of the line, while to the right of dotted slanted line 142, pure cadmium is deposited. Between lines 141 and 142, there is deposited cadmium telluride; thus near the dotted lines 141 there is a slight excess of tellurium in the cadmium telluride, while near line 145 there is a slight excess of cadmium in the cadmium telluride.

Adjacent the curve 140 are the letters n and p to denote where n-type cadmium telluride of p-type cadmium telluride is deposited as a function of the plating or deposition voltage ($V_{dep}$). The chart of FIG. 14 was obtained with a pH of 3.4 and with an electrolyte containing cadmium sulfate 1.2 m, that is 1.2 molar with saturated tellurium oxide ($TeO_2$) and a temperature of 85° C.

The curve of FIG. 14 is an experimental curve for the conditions recited. Also, the rest potential is the potential measured by a recorded immediately after switching off the current. Thereupon, the resulting curve plotting voltage as a function of time changes slope abruptly at a point accurately defining the par ticular rest potential. The theory shows slanted dotted lines 145 to the abscissa relate deposition potential to rest potential.

It will be realized that this curve will change with variations of the plating temperature, the pH and the concentrations of the reactants. Hence, the various parameters given for Example 7 are not those for which the chart of FIG. 14 was obtained but the results are similar.

However, it will be evident that this chart demonstrates that p-n homojunctions of cadmium telluride may be obtain simply by changing the deposition or plating voltage, or by changing the pH or other variables of the plating process. Thus, for a lower pH (high acidity) the curve 140 will be higher.

It will also be noted that the set of dashed lines 145 interconnecting various points on the curve 140 to various points on the voltage scale are inclined with respect to a vertical line. However, they do correlate the voltages with the various points on the curve. Thus, for the chart of FIG. 14, at voltages more negative than −0.3 volts, n-type cadmium telluride will be deposited. At voltages more positive than −0.3 volts, a p-type cadmium telluride will be obtained.

EXAMPLE 8

In order to produce a Schottky barrier solar cell by the method of the present invention, the ITO cathode described in Example 1 was directly plated with tellurium as described in the fourth step of Example 1, except that the pH was about 2.2 and the plating was carried out at a −0.550 volts for about 20 minutes. The resulting cell when tested, exhibited an open circuit voltage about 100 millivolts.

EXAMPLE 9

Another example of the method of the present invention is to deposit on the cathode described in Example 1, a layer of cadmium telluride without doping and with the pH and plating voltage adapted to produce intrinsic cadmium telluride, i.e., cadmium telluride which is substantially stoichiometric in proportion and having little, if any, n-type or p-type characteristics. Subsequent to the deposition of such intrinsic layer of cadmium telluride, a p-type layer of cadmium telluride may be deposited, as set forth in Example 4 above, forming what is known as a P-I-N cell structure.

EXAMPLE 10

Another example of the method of the present invention is to utilize the same process as set forth in the foregoing example except that in place of the p-type cadmium telluride layer which is deposited as the final step, a layer of tellurium may be plated instead as described in the fourth step of Example 1.

EXAMPLE 11

In making another Schottky barrier junction by the method of the present invention, an n-type or p-type layer is deposited by electroplating onto a suitable metal substrate. The metal may, for example, consist of nickel, steel, cadmium, platinum, gold, or silver. The semiconductive layer to be deposited may, for example, consist of n-type or p-type cadmium telluride, either of which may be deposited in the manner previously described. In the case of an n-type cadmium telluride layer, an n-type donor, such as indium, may be added. On the other hand, in the case of a p-type semiconductor layer, a p-type acceptor, such as arsenic, may be added. The light preferably impinges from the surface of the semiconductive layer. The electrodes are applied as explained hereinbefore. Instead of using cadmium telluride, it is also feasible to utilize cadmium sulfide (CdS), cadmium selenide (CdSe) or zinc selenide (ZnSe).

EXAMPLE 12

Instead of varying the plating voltage to deposit cadmium telluride of n- or p-type as previously explained, it is also possible to vary the concentration of the cadmium in the electrolyte to obtain n-type or p-type cadmium telluride layers. Thus, a first layer may be deposited on a substrate, as previously explained, from a solution having a pH of 2.5 and saturated with tellurium dioxide ($TeO_2$). The electrolyte contains a cadmium ion concentration of 0.1 M. The current density for the plating is 0.1 mA per square centimeter of plated area. This will produce an n-type cadmium telluride layer. The plating time is about one hour to one and one-half hours.

Subsequently, a second layer is deposited from a similar solution. The only difference is that the cadmium ion concentration is 0.001 M with the same current density and the same plating time. This, in turn, will provide a p-type cadmium telluride layer. Hence, a homojunction device is provided having an n-p junction between two layers of cadmium telluride. Similarly, the change in cadmium telluride stoichiometry can be achieved by varying the pH of the electrolyte. For example, the lower the pH, the more tellurium dissolved in the cadmium sulfate electrolyte and more tellurium is deposited with the cadmium telluride.

The method for producing the photo-voltaic power cells of the present invention can also be effectively operated with a plurality of anodes, as illustrated in the arrangements of FIGS. 10 and 11. In this case, the method would also utilize a container 110, such as a beaker, equivalent to the container 100. Moreover, in the arrangement illustrated in FIG. 10, a relatively inert cathode 112, as, for example, a cathode formed of glass with a conductive oxide coating, as shown, would also be utilized, along with a neutral anode 114 formed of an inert material, as, for example, platinum as shown. In addition, a second anode 116 formed of cadmium would be utilized. The two anodes 114 and 116 are connected to the cathode 112 through a source of electrical current 118. Potentiometers 120 and 122 are respectively connected to the anodes 114 and 116 and to the source 118, in the configuration as illustrated in FIG. 10. Also, the cathode 112, along with the anodes 114 and 116, are also disposed in a suitable electrolyte 124, as those electrolytes heretofore described and as hereinafter described.

The anode 116 which is formed of cadmium may otherwise be a cadmium-plated anode. In like manner, the anode 116 could be formed of an alloy of cadmium with a desired dopant. Tellurium ions would be provided in solution, as, for example, by a tellurous acid composition. By carefully controlling the current flow to the respective anodes 114 and 116, it is possible to introduce cadmium into solution from the anode 116. In this way, the tellurium ions contained in the tellurous acid will be discharged at the cathode 112, and in like manner the cadmium entered into solution from the anode 116 will also be discharged at the cathode 112. In order to form cadmium sulfide or cadmium selenide, $H_2SO_3$ would be used to form the cadmium sulfide and $H_2SeO_3$ would be used to form the cadmium selenide.

Again, a first layer could be formed on the cathode 112 or other inert cathode, and which would either constitute an n-type or a p-type region according to the amount of cadmium introduced from the anode 116 into solution. The amount of cadmium introduced via the cadmium anode can be controlled by adjustment of the two potentiometers 120 and 122. Thereafter, a second layer could be formed on the first-mentioned layer in order to form either a p-type region or an n-type region which is opposite to the first deposited layer. In all cases where two anodes are employed in the arrangement as illustrated in FIG. 10, or otherwise the arrangement illustrated in FIG. 11 as hereinafter described, the ratio of the metal ion to the non-metal ion or molecule in the compound which is deposited is determined by the currents flowing through the respective anodes to the single cathode. Moreover, it can also be observed that it is equally easy to provide semiconductor films with a homojunction as well as a heterojunction. By merely changing the electrolyte to form the second layer, it will be possible to form the heterojunction materials.

FIG. 11 illustrates an arrangement whereby a non-metal anode 126 is used in place of the cadmium anode 116. Moreover, the electrolyte 124 would be replaced by an electrolyte 128 containing cadmium ions in solution. As indicated, the cadmium could be introduced in the solution, as, for example, from a solution of cadmium salts. In accordance with this arrangement, it is possible to carefully control the amount of tellurium introduced into solution through adjustment of the respective potentiometers 120 and 122.

The tellurium anode of FIG. 11 could also be formed as an alloy with, e.g., antimony, phosphorus or arsenic, etc., to provide a dopant. In either case, the use of the two anodes provides a means to continually supply the minority component in order to slowly replenish the same in solution. Replenishing of the minority component, generally the more noble component, is usually required when there is a large ratio between the concentrations of the majority and minority components in the electrolyte In the case where two anodes are not employed, and where a large ratio does exist, the minority component could be slowly added on a continued basis, as by dripping the same into the electrolyte, based on the ratio of depletion of the minority component.

In any of these embodiments illustrated in FIGS. 10 and 11, it is possible to provide the p-type region and n-type region by stoichiometrically adjusting the amount of cadmium with respect to the non-metals, such as tellurium, selenium, sulfur, etc. Otherwise, it is possible to introduce dopants into the solutions. In the more preferred form, the dopant could actually be contained within the material formed in one of the anodes as an alloy thereof, as, for example, cadmium-indium alloys as an anode.

With respect to the use of the three or more electrodes, it should be understood that plating could occur on one of the electrodes, which may not constitute a cathode per se. By properly adjusting the components in the electrolyte and by adjusting the potential applied to the electrodes, it is actually possible to perform anodic deposition and cathodic deposition at the same time. FIG. 12 illustrates an arrangement with three electrodes with one of the electrodes 129 being formed of a sulfur-containing material and the other of the electrodes 130 being formed of a cadmium-containing material. A third electrode 132 is also provided and is preferably of an inert material. Again, by mere adjustment of two potentiometers, e.g. the two potentiometers 120 and 122, it is possible to carefully regulate the amount of cadmium and sulfur ions which are introduced into solution and which are discharged at the electrode 132 in order to form a cadmium sulfide film, as illustrated.

While cadmium sulfide has been described herein as an example, any of the other metal and non-metal components could be used. Moreover, in this embodiment, the electrodes cannot be defined as cathodes and anodes in the classical sense. By way of example, the electrode 129 could have, e.g., a negative 2-volt potential, the electrode 132 could have, e.g., a positive 2-volt potential, and the electrode 130 could have, e.g., a positive 4-volt potential. In this way, cadmium from the electrode 130 would be discharged and plate out on the electrode 132 through a cathodic process and sulfur from the electrode 129 would be discharged and plate out on the electrode 132 through an anodic process.

As used herein, the terms "inert" or "relatively inert," as, for example, with an "inert anode" or "inert cathode," refer to a material which is inert with respect to the reactants being employed. Thus, in the case of an inert cathode, such as a nickel cathode, the cathode would be inert and nonreactive with respect to the electrolyte or any of the ions introduced therein in order to form the semiconductor film on the cathode.

The present invention is highly effective in obtaining relatively thin films by use of the electrochemical techniques described herein. In this instance, films with a thickness ranging from about 0.1 micron to about 40 microns and larger can be obtained as described above. Thus, the use of the term "thin" or "relatively thin" with respect to the film thickness will be based on film thicknesses within the range of about 0.1 micron to about 40 microns, or perhaps greater.

While the present invention is effective with those materials described above, and which can be made in accordance with the processes of the present invention, one of the most effective materials thus found for use in the production of the photo-voltaic cells is that formed of cadmium telluride. It has been found that photo-voltaic cells based on p-n homojunctions have an expected energy conversion efficiency that is a function of the band-gap of the material used with the optimum band-gap occurring near approximately 1.5 eV. Moreover, it has been found that cadmium telluride provides a band-gap in this range. In addition, the cadmium telluride provides a reasonably high efficiency and also a lower cost with respect to other materials which might be employed. Cadmium telluride is also stable in air, is nontoxic and can withstand temperature variations of several hundred degrees above and below ambient temperatures without decomposing. Moreover, cadmium telluride is preferred inasmuch as it is neither deliquescent or hygroscopic, and furthermore, is not subject to disproportionation under conditions of expected terrestrial operation.

FIG. 13 illustrates the steps employed in the method of producing the photo-voltaic power cells in accordance with the present invention. These steps were actually delineated in connection with the previous description. However, referring to FIG. 13, it can be observed that a metal cathode is introduced into the electrolyte and an anode is introduced into the electrolyte. The method includes the formation of molecules or ions of the non-metallic component in the electrolyte and the formation of ions of the metallic component in the electrolyte. As indicated previously, these ions could be introduced into solution in several different ways, and the ions of both ccomponents would be discharged at the cathode during the application of the electric field. Both ions and molecules can migrate to the cathode, and upon application of the electric field they are discharged and form a coating in the form of a compound semiconductor, as previously described. As indicated above, the coating would be first formed with a first region such as an n-type region or a p-type region. The coating would then be provided with a second region which is the opposite of the first region.

Finally, in the making of the photo-voltaic power cells, conductive terminals could be applied to both the n-region and the p-region. Otherwise, these terminals could be applied to layers in contact with the n-region and the p-region in connection with the embodiments illustrated in FIGS. 3 and 4 of the drawings.

One of the unique results which can be obtained in accordance with the present invention is that either a homojunction or a heterojunction can be established between the p-type region and the n-type region. In this way, problems of material waste and impurities are substantially reduced, and almost completely eliminated. Furthermore, all of the heretofore required stringent control procedures used in the formation of photo-voltaic cells and similar semiconductor materials can be completely obviated.

Another one of the unique aspects of the present invention is that the reactions heretofore described may be carried out at or close to room temperature. Moreover, and as indicated, the processes described herein result in very little, if any, waste material. In addition, the processes can be carried out with very little concentrations of the required ions.

The configuration and method of fabrication of the photo-voltaic power generating means in accordance with the present invention lend themselves to continuous processes of production of substantial lengths and areas of such power generating means. In many applications, power generating means may be wound upon a roller or other storage means and simply laid out as a sheet or surface covering areas exposed to light, such as roofs and walls exposed to solar radiation.

Thus, there has been illustrated and described novel photo-voltaic power generating means and methods of use and methods of fabricating such power generating means with a relatively high degree of efficiency and which fulfill all of the objects and advantages sought therefor. Many changes, modifications, variations and other uses and applications of the power generating means and methods described herein will become apparent to those skilled in the art after considering this specification and the accompanying drawings. All such changes, modifications, variations and other uses and applications which do not depart from the spirit and scope of the invention are deemed to be covered by the invention which is limited only by the following claime.

What is claimed is:

1. A method of preparing a photo-voltaic power generating cell comprising:
   depositing electrochemically on a suitably prepared metal electrode adapted to form a Schottky barrier a coating of a semiconductor compound from an electrolytic bath including the components of said semiconductor compound, said compound being capable of forming a Schottky barrier with said electrode, being transmissive to light radiation and being capable of forming electron-hole pairs upon being irradiated with photons, said components being formed of at least one of the metal elements of Class IIB and non-metal elements of Class VIA of the Periodic Table of Elements.

2. A method as defined in claim 1 wherein said metal electrode is nickel and said semiconductor compound is cadmium sulfide.

3. In a process for depositing a photo-voltaic cell on an electrically conductive semiconductive substrate of a first conductivity type, the steps of:
   immersing the substrate into an electrolytic bath including an acid solution of cadmium sulfate;
   providing an anode having at least a surface layer of tellurium;
   applying a voltage between the anode and the substrate forming a cathode, the voltage being negative between the cathode and a calomel reference electrode; and
   continuing the plating process until a first thin polycrystalline cadmium telluride layer of said first conductivity type is deposited.

4. In the process defined in claim 3 wherein the substrate is of the n-type and consists of indium tin oxide, and wherein the first conductivity type is the n-type.

5. In the process defined in claim 4 wherein the electrolytic bath includes an n-type donor impurity for codeposition with the n-type cadmium telluride.

6. In the process defined in claim 5 wherein the n-type donor impurity consists of indium sulfate.

7. In the process defined in claim 4 which includes the additional steps of:
   removing the n-type cadmium telluride layer from the influence of the electric voltage whereby a thin p-type layer is formed;
   subjecting the thus formed p-type layer to the influence of a p-type acceptor in the electrolytic bath without applying a voltage thereto; and
   electroplating a thin tellurium layer onto said p-type layer from an electrolyte including sodium sulfate without any doping impurities by applying a negative voltage for a time sufficient to create a tellurium layer having a predetermined thickness at an acid pH.

8. In the process defined in claim 7 wherein the p-type acceptor for the formation of the p-type layer consists of arsenic pentoxide.

9. In the process defined in claim 3 wherein the substrate is of the p-type and consists of antimony doped tin oxide, and wherein the first conductivity type is the p-type.

10. In the process defined in claim 9 wherein the electrolytic bath includes a p-type acceptor impurity for codeposition with the p-type cadmium telluride.

11. In the process defined in claim 3 which includes the following additional steps:
    providing an additional electrolyte including cadmium sulfate and an active impurity of the opposite conductivity type;
    immersing the substrate and the first cadmium telluride layer in the additional electrolyte; and
    applying a negative voltage with respect to a calomel reference electrode between the cathode and anode, the applied voltage being different from that utilized for depositing the first cadmium telluride layer, thereby to deposit a second thin polycrystalline cadmium telluride layer of the opposite conductivity type, whereby an n-p junction is formed between the first and second cadmium telluride layers to provide a homojunction device.

12. In the process defined in claim 11 wherein the substrate is of the n-type and consists of indium tin oxide and wherein the first conductivity type is the n-type, and wherein the additional electrolyte includes a p-type acceptor impurity and wherein the second cadmium telluride layer is of the p-type.

13. In the process defined in claim 12 wherein the plating voltage for the first cadmium telluride layer between the cathode and the calomel reference electrode is more negative than that applied between the cathode and the calomel reference electrode for the second cadmium telluride layer, whereby more tellurium and less cadmium is deposited for the second layer than for the first layer.

14. The process as defined in claim 12 wherein the p-type acceptor impurity consists of arsenic pentoxide.

15. The process of manufacturing an n-p heterojunction photo-voltaic device utilizing a semiconductive substrate of a first conductivity type, comprising the steps of:
    immersing the substrate into an electrolyte comprising cadmium sulfate at an acid pH;
    providing an anode having at least a tellurium coating;
    applying a voltage between the cathode formed by the substrate and the anode, the voltage being negative between the cathode and a calomel reference electrode so as to deposit an opposite conductivity type thin polycrystalline cadmium telluride layer; and
    continuing the plating until the layer has a predetermined thickness, whereby an n-p heterojunction is provided between the substrate of a first conductivity type and the plated cadmium tellurium layer of the opposite conductivity type.

16. The process defined in claim 15 wherein the substrate is of the n-type and consists of indium tin oxide and wherein the cadmium telluride layer is of the p-type and is obtained by depositing relatively more tellurium than cadmium.

17. The process defined in claim 16 wherein the electrolyte additionally contains a p-type acceptor impurity for codeposition with the cadmium telluride layer.

18. The process defined in claim 17 wherein said p-type acceptor impurity consists of arsenic pentoxide.

19. The process defined in claim 16 wherein the negative deposition voltage between the cathode and the calomel reference electrode is so selected with respect to the pH, that a p-type layer of cadmium telluride is formed having more telluride than cadmium.

20. The process defined in claim 15 wherein the substrate is of the p-type and consists of antimony doped tin oxide, and wherein the opposite conductivity type is the n-type, the n-type cadmium telluride layer being formed by applying a negative deposition voltage between the cathode and the calomel reference electrode so selected that an n-type cadmium telluride layer is formed having less telluride than cadmium.

21. The process defined in claim 20 wherein the electrolyte additionally includes an n-type donor impurity.

22. The process defined in claim 21 wherein the n-type donor impurity consists of indium sulfate.

23. A process for manufacturing a Schottky barrier photo-voltaic device comprising the steps of:
   immersing a metal substrate into an electrolytic bath including cadmium sulfate and serving as a cathode;
   providing an anode in the bath having at least an outer coating of tellurium;
   maintaining the electrolytic bath at an acid pH; and
   applying a voltage between the cathode and anode, a negative voltage being measured between the cathode and a calomel reference electrode, the voltage being so selected with respect to the pH that the deposited cadmium telluride consists of a predetermined ratio of cadmium to tellurium to deposit a predetermined conductivity type layer, the deposition being continued until a thin polycrystalline cadmium telluride layer of predetermined thickness is deposited, said metal substrate being capable of forming a Schottky barrier with the deposited cadmium telluride.

24. The process as defined in claim 23 wherein the cadmium telluride layer is of the n-type and is obtained by deposition more cadmium than tellurium.

25. The process as defined in claim 24 wherein an n-type donor impurity is introduced into the electrolytic bath for codeposition with the cadmium telluride.

26. The process defined in claim 25 wherein the n-type donor impurity consists of indium sulfate.

27. The process defined in claim 23 wherein the deposited cadmium telluride layer is of the p-type and consists of less cadmium than tellurium.

28. The process defined in claim 27 wherein a p-type acceptor impurity is introduced into the electrolytic bath for codeposition with the cadmium telluride.

29. The process defined in claim 28 wherein the p-type acceptor impurity consists of arsenic pentoxide.

30. The process for forming a photo-voltaic cell on an electrically conductive n-type semiconductive substrate consisting of indium tin oxide, the process comprising the steps of:
   immersing the substrate into an electrolytic bath including an acid solution of cadmium sulfate;
   providing an anode having at least a surface layer of tellurium;
   applying a plating voltage between the anode and the substrate forming the cathode, the voltage being negative between the cathode and a calomel reference electrode;
   continuing the plating process until a thin polycrystalline cadmium telluride layer of n-type conductivity is deposited;
   immersing the n-type cadmium telluride layer into an electrolytic bath including an acid solution of cadmium sulfate and sodium sulfate;
   converting the surface of the cadmium telluride layer into a p-type cadmium telluride layer; and
   electroplating a thin tellurium layer onto said p-type cadmium telluride layer for a predetermined period of time to create a tellurium layer of predetermined thickness.

31. The process defined in claim 30 wherein a p-type acceptor impurity is added to the electrolytic bath for plating the p-type cadmium telluride layer.

32. The process defined in claim 31 wherein the p-type acceptor impurity consists of arsenic pentoxide.

* * * * *